United States Patent [19]

Kurita

[11] Patent Number: 4,989,845
[45] Date of Patent: Feb. 5, 1991

[54] PELLET ACCOMMODATING AND ALIGNING JIG

[75] Inventor: Yoshio Kurita, Kyoto, Japan

[73] Assignee: Rohm Co., Ltd., Kyoto, Japan

[21] Appl. No.: 447,826

[22] Filed: Dec. 8, 1989

[30] Foreign Application Priority Data

Dec. 9, 1988 [JP] Japan ................. 63-312563

[51] Int. Cl.⁵ ............................................. B25B 11/00
[52] U.S. Cl. ................................................... 269/21
[58] Field of Search ................. 248/638; 494/82; 221/200; 222/196; 269/21, 13, 14; 29/271

[56] References Cited

U.S. PATENT DOCUMENTS

| | | | |
|---|---|---|---|
| 3,949,295 | 4/1976 | Moorshead | 269/21 |
| 4,301,999 | 11/1981 | Higgins et al. | 269/21 |
| 4,457,840 | 7/1984 | Nagl | 222/196 |

Primary Examiner—Robert C. Watson
Attorney, Agent, or Firm—Wenderoth, Lind & Ponack

[57] ABSTRACT

A pellet accommodating and aligning jig includes an upper portion having an upper surface in which a plurality of pellet accommodating recesses are formed, and a lower portion having a lower surface. A first through-bore extends between the bottom of each of the pellet accommodating recesses and the lower surface. The end of the first through-bore adjacent the bottom of the recesses constitutes a vacuum exhaust inlet and the end adjacent the lower surface constitutes a vacuum exhaust outlet. Pellets placed in the pellet accommodating recesses are attracted toward the bottoms of the recesses when air is evacuated from the vacuum exhaust inlets of the first through-bores towards the vacuum exhaust outlets. The pellet accommodating and aligning jig further includes a micromesh member formed with a plurality of independent second through-bores each having a diameter smaller than that of each first through-bore, and disposed at the bottom of each of the pellet accommodating recesses.

2 Claims, 2 Drawing Sheets

PELLET ACCOMMODATING AND ALIGNING JIG

BACKGROUND OF THE INVENTION

The present invention generally relates to a jig, and more particularly, to a pellet accommodating and aligning jig which is provided with a plurality of pellet accommodating recesses formed in its upper surface, and first through-bores each extending between a bottom of a respective one of said pellet accommodating recesses and a lower surface of said jig. The end of each said through-bore adjacent the bottom of a recess constitutes a vacuum exhaust inlet and the end thereof adjacent the lower surface constitutes a vacuum exhaust outlet, whereby pellets placed in said pellet accommodating recesses are attracted toward the bottoms thereof owing to the evacuation of air from the vacuum exhaust inlets of said first through-bores towards the vacuum exhaust outlets thereof.

As shown in FIGS. 4 and 5, a conventional pellet accommodating and aligning jig J includes an upper portion 2 formed with a plurality of pellet accommodating recesses 4, and a lower portion 8 provided with first through-bores 14 each formed between a bottom face 6 defining the bottom of each of said pellet accommodating recesses 4 and a lower surface 8. The end of through-bore 14 at the bottom face 6 constitutes a vacuum exhaust inlet 10 and the end thereof at lower surface 8 constitutes a vacuum exhaust outlet 12. Respective pellets 16 placed on the bottom faces 6 defining the bottoms of the corresponding pellet accommodating recesses 4 are attracted onto said bottom faces 6 owing to the evacuation of air from the vacuum exhaust inlet 10 towards the vacuum exhaust outlet 12 in a direction indicated by an arrow 18.

In the known pellet accommodating and aligning jig J as described above, in the case where, for example, pellets of diodes or the like, each constituted by a main body 16a and a bump portion 16b, are to be accommodated and aligned within the recesses 4 in a correct attitude in which the main body 16a thereof faces the bottom face 6 as shown in FIG. 4, the main body 16a of each pellet 16 is directed towards the bottom face 6 by, for example, vibrating the pellet accommodating and aligning jig J during the evacuation of air or vacuum formation so that the bump portion 16b does not confront the bottom face 6 defining the bottom of the recess 4.

However, since the bump portion 16b will close the first through-bore 14 if the evacuation is effected in the state where the bump portion 16b is directed toward the bottom face 6 as in FIG. 5, the pellet 16 is attracted onto the bottom face 6 in the above posture and thus, the pellets 16 are undesirably arranged in a state in which they are mis-aligned within the pellet accommodating recesses 4.

SUMMARY OF THE INVENTION

Accordingly, an essential object of the present invention is to provide a pellet accommodating and aligning jig which is capable of correctly accommodating and aligning even pellets having bump portions or the like within pellet accommodating recesses of the jig, while evacuation is being effected.

Another object of the present invention is to provide a pellet accommodating and aligning jig of the above-described type, which has a simple structure, which functions reliably, and which can be readily manufactured at a low cost.

In accomplishing these and other objects, according to one preferred embodiment of the present invention there is provided a pellet accommodating and aligning jig which includes an upper portion having an upper surface formed with a plurality of pellet accommodating recesses therein, a lower portion having a lower surface, a first through-bore extending between a bottom of each of the pellet accommodating recesses and the lower surface with the end of the first through-bore adjacent the bottom of the recess constituting a vacuum exhaust inlet and the end adjacent said lower surface constituting a vacuum exhaust outlet, whereby pellets in the pellet accommodating recesses are attracted toward the bottoms of the recesses owing to the evacuation of air from the vacuum exhaust inlets of the first through-bores towards the vacuum exhaust outlets and a micromesh member formed with a plurality of independent second through-bores each having a diameter smaller than that of each first through-bore, and disposed at the bottom of the pellet accommodating recesses.

In the arrangement according to the present invention as described above, owing to the fact that the diameter of each of the second through-bores formed in the micromesh member provided at the bottom of the pellet accommodating recesses is set to be smaller than that of each of the first through-bores, when the evacuation of air is effected through the first through-bore while the jig is being vibrated, even if one or more of the second through-bores are closed by the bump portion or the like of the pellet directed towards the bottom of the recess, the remaining ones of the second through-bores still communicate with the first through-bore, and therefore, the pellet is not attracted to the bottom face defining the bottom of the pellet accommodating recess. Accordingly, if the jig is continuously subjected to vibration, the pellets are correctly aligned in the state in which the main body sides thereof confront the bottom of the pellet accommodating recesses.

BRIEF DESCRIPTION OF THE DRAWINGS

These and others objects and features of the present invention will become apparent from the following description taken in conjunction with the preferred embodiment thereof with reference to the accompanying drawings, in which.

DETAILED DESCRIPTION OF THE INVENTION

Figure 1:
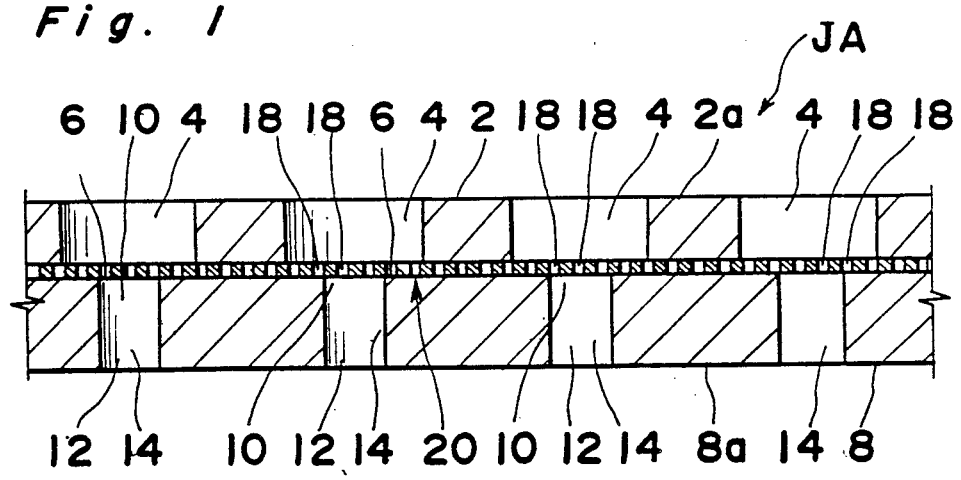
FIG. 1 is a fragmentary side sectional view of one embodiment of a pellet accommodating and aligning jig according to the present invention.

Before the description of the present invention proceeds, it is to be noted that like parts are designated by like reference numerals through the accompanying drawings.

Figure 2:
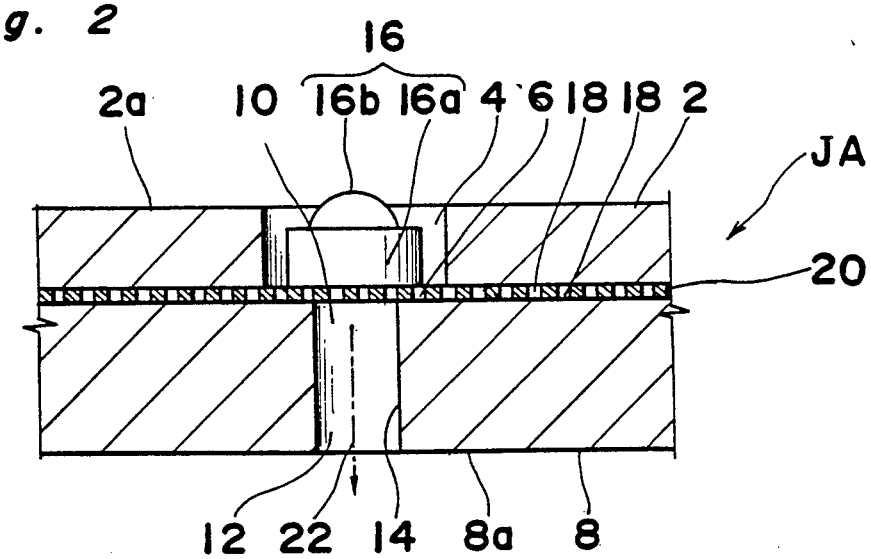
FIGS. 2 and 3 are views similar to FIG. 1 showing an essential portion of the jig on an enlarged scale.
Figure 3:
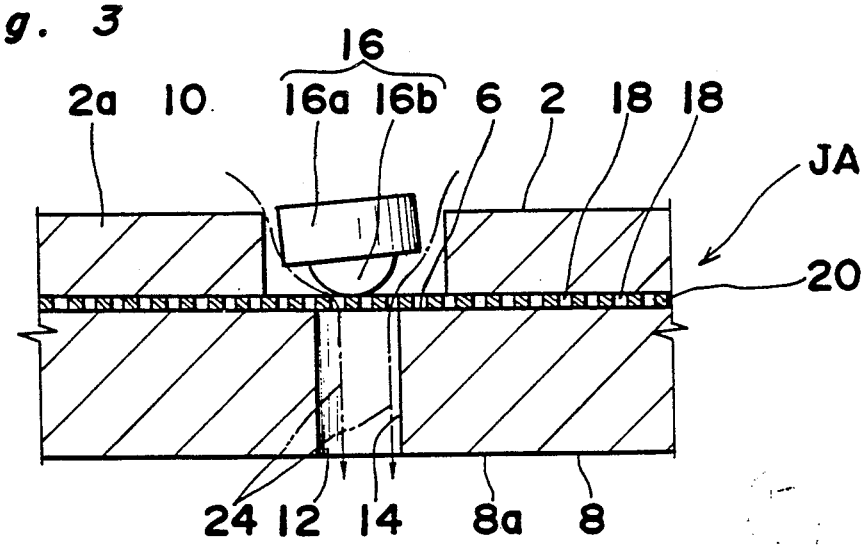

Referring now to the drawings, there is shown in FIGS. 1 to 3, a pellet accommodating and aligning jig JA according to one preferred embodiment of the present invention, which includes an upper portion 2 having an upper surface 2a formed with a plurality of pellet accommodating recesses 4 therein, and lower portion 8 defining a lower surface 8a. A first through-bore 14 extends between a bottom surface 6 defining the bottom of each of the pellet accommodating recesses 4 and the lower surface 8a. The end of said first through-bore 14 that is open at the bottom face 6 defining the bottom of a respective recess 4 constitutes a vacuum exhaust inlet 10, and the end thereof that is open at lower surface 8a constitutes a vacuum exhaust outlet 12, whereby pellets 16 placed in the pellet accommodating recesses 4 are attracted to faces 6 when air is evacuated from the vacuum exhaust inlets 10 of the fist through-bores 14 towards the vacuum exhaust outlets 12.

The construction of the pellet accommodating and aligning jig JA in FIGS. 1 to 3 according to the present invention as described so far is generally similar to that of the conventional pellet accommodating and aligning jig J described earlier with reference to FIGS. 4 and 5.

Figure 4:
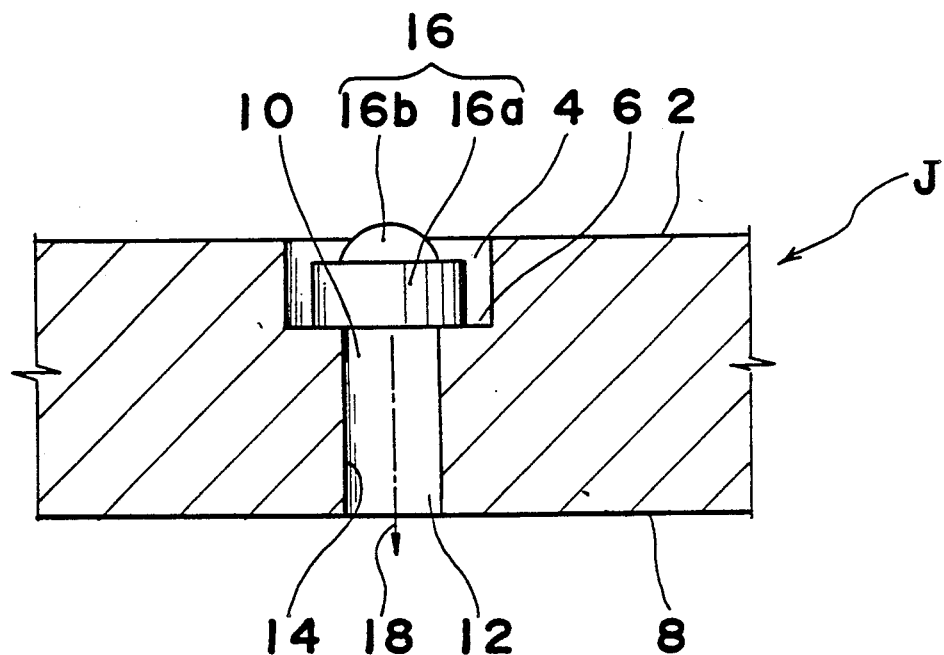
FIGS. 4 and 5 are views similar to FIGS. 2 and 3, showing a conventional pallet accommodating and aligning jig (already referred to).
Figure 5:
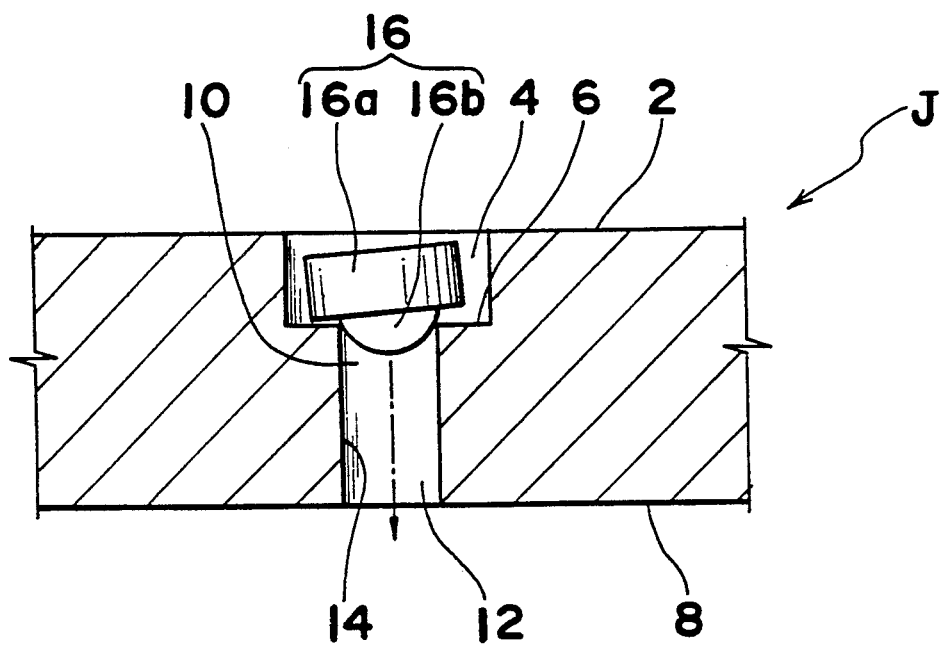

According to the present invention, the construction of the pellet accommodating and aligning jig JA is different from that of the conventional arrangement J in FIGS. 4 and 5 with respect to the following feature.

Specifically, the pellet accommodating and aligning jig JA of the present embodiment in FIGS. 1 to 3 is characterized in that there is further provided a micromesh member 20 which is formed with a plurality of independent second through-bores 18 each having a diameter smaller than that of each first through-bore 14, and is disposed at the bottom faces 6 defining the bottoms of the pellet accommodating recesses 4 as shown in FIGS. 1 to 3.

Referring particularly to FIGS. 2 and 3, functions of the pellet accommodating and aligning jig JA described above will be explained hereinafter.

In the first place, when the main body portion 16a of the pellet 16 confronts the bottom face 6 defining the bottom of the pellet accommodating recess 4 through vibration of the pellet accommodating and aligning jig JA as shown in FIG. 2, since the main body portion 16a closes the first through-bore 14 via the micromesh member 20, the pellet 16 is attracted and held within the recess 4 upon the evacuation of the interior of the first through-bore 14 in a direction indicated by an arrow 22.

Meanwhile, in the case where the bump portion 16b of the pellet 16 faces the bottom face 6 defining the bottom of the recess 4 owing to vibration of the jig JA, even when some of the second through-bores 18 are closed by the bump portion 16b of the pellet 16, remaining ones of the second through-bores 18, and also, the first through-bore 14, are not closed by the bump portion 16b. Accordingly, even if it is intended to subject the interior of the first through-bore 14 to evacuation or vacuum formation, a vacuum state is not established since the recess 4 and the first through-bore 14 communicate with each other through passages as indicated by arrows 24, i.e. via the passages through the second through-bores 18 of the micromesh member 20. Consequently, since the pellet 16 is not attracted toward the bottom face 6 defining the bottom of the recess 4, it is finally inverted from the state in FIG. 3 to the state of FIG. 2 upon vibration of the pellet accommodating and aligning jig JA, and thus, all pellets 16 will be aligned in the correct accommodating state within the recess 4 as desired.

As is clear from the foregoing description, in the pellet accommodating and aligning jig according to the present invention, since the micromesh member formed with the plurality of second through-bores each having a diameter smaller than that of each first through-bore is provided at the bottom of the pellet accommodating and aligning recess, in the case where the evacuation is effected through the first through-bore, with the jig being vibrated, even if one or more of the second through-bores are closed by the bump portion or the like of the pellet located at the bottom of the recess, remaining ones of the second through-bores are still maintained in communication with the first through-bore and thus, the pellet is not attracted toward the bottom of the pellet accommodating recess. Accordingly, as the jig is continuously subjected to vibration, all the pellets are uiltimately aligned correctly in the state whet the main body sides thereof are directed towards the bottom faces defining the bottoms of the pellet accommodating recesses.

Therefore, according to the present invention, an improved pellet accommodating and aligning jig capable of accommodating and aligning pellets even having bump-like portions, correctly within the pellet accommodating recesses while the evacuation is being effected, may advantageously have a simple structure that is produceable at a low cost.

Although the present invention has been fully described by way of example with reference to the accompanying drawings, it is to be noted here that various changes and modifications will be apparent to those skilled in the art. Therefore, unless such changes and modifications otherwise depart from the scope of the present invention, they should be construed as included therein.

What is claimed is:

1. A pellet accommodating and aligning jig comprising an upper portion defining an upper surface of the jig and a plurality of pellet-accommodating recesses extending therein from said upper surface to surfaces in the jig defining the bottoms of said recesses, respectively; a lower portion defining a lower surface of the jig and a respective through-bore extending between said bottom surface and each of the surfaces defining the bottoms of said pellet-accommodating recesses wherein each respective said through-bore has one end open at said bottom surface of the jig and another end open to a respective one of said pellet-accommodating recesses, said one end constituting a vacuum exhaust inlet and said another end constituting a vacuum exhaust outlet through which air in each said through-bore can be evacuated to attract pellets in said pellet-accommodating recesses to said surfaces defining the bottoms of said recesses; and a micromesh member disposed at the bottoms of said pellet-accommodating recesses and defining a plurality of apertures therethrough, said apertures having respective diameters that are smaller than the diameter of each respective said through-bore.

2. A pellet aligning system comprising:
a pellet accommodating and aligning jig having an upper portion defining an upper surface of the jig and a plurality of pellet-accommodating recesses extending therein from said upper surface to surfaces in the jig defining the bottoms of said recesses, respectively, a lower portion defining a lower surface of the jig and a respective through-bore extending between said bottom surface and each of the surfaces defining the bottoms of said pellet-accommodating recesses wherein each respective said through-bore has one end open at said bottom surface of the jig and another end open to a respective one of said pellet-accommodating recesses, said one end constituting a vacuum exhaust inlet having a diameter smaller than the diameter of said respective one of said pellet-accommodating recesses, said another end constituting a vacuum exhaust outlet, and a micromesh member disposed at the bottoms of said pellet-accommodating recesses and defining a plurality of apertures therethrough, said apertures having respective diameters that are smaller than the diameter of each respective said through-bore;

the jig mounted in the system so as to be vibratable and so as to be connectable to a vacuum system which will evacuate air from each respective said through-bore in a direction from said exhaust inlet to the exhaust outlet thereof; and a plurality of pellets received in said pellet-accommodating recesses, respectively, each of said pellets having a main body portion of a diameter larger than the diameter of the exhaust inlet, and a bump portion defining a bump on said main body portion, whereby when said jig is vibrated and air is evacuated from each respective said through-bore in a direction from said exhaust inlet to said exhaust outlet, only those pellets that are disposed in respective ones of said recesses and which are in a first orientation in which the body portions thereof cover all of the apertures of said micromesh member located over the through-bores open to said respective ones of said recesses will be attracted toward the surfaces of the jig defining the bottoms of said respective ones of said recesses, while other ones of said pellets, that are disposed in other ones of said recesses and which are in a second orientation in which the bump portions thereof face said micromesh member, remain free to vibrate within said other ones of said recesses into said first orientation.

* * * * *